(12) United States Patent
Yanagida

(10) Patent No.: US 7,017,263 B2
(45) Date of Patent: Mar. 28, 2006

(54) ELECTRONIC COMPONENT MOUNTING METHOD

(75) Inventor: Tsutomu Yanagida, Gunma (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 92 days.

(21) Appl. No.: 10/850,440

(22) Filed: May 21, 2004

(65) Prior Publication Data

US 2005/0005435 A1 Jan. 13, 2005

(51) Int. Cl.
*H05K 3/30* (2006.01)

(52) U.S. Cl. .............................. 29/833; 29/739; 29/740; 29/825; 29/832

(58) Field of Classification Search .................. 29/825, 29/832, 833, 739, 740
See application file for complete search history.

(56) References Cited

U.S. PATENT DOCUMENTS

| | | | | |
|---|---|---|---|---|
| 4,494,139 | A * | 1/1985 | Shima et al. .................. | 348/87 |
| 6,246,789 | B1 * | 6/2001 | Hosotani et al. ............ | 382/151 |
| 6,374,484 | B1 * | 4/2002 | Yoshida et al. ............... | 29/740 |
| 6,550,135 | B1 * | 4/2003 | Nakahara et al. ............. | 29/833 |
| 6,631,552 | B1 * | 10/2003 | Yamaguchi .................. | 29/739 |
| 6,830,989 | B1 * | 12/2004 | Shida et al. ................. | 438/460 |
| 6,902,090 | B1 * | 6/2005 | Yamamura et al. ........... | 226/32 |

FOREIGN PATENT DOCUMENTS

JP 05-199000 1/1992

* cited by examiner

*Primary Examiner*—Carl J. Arbes
(74) *Attorney, Agent, or Firm*—Morrison & Foerster LLP

(57) ABSTRACT

The invention provides an electronic component mounting method which improves a work efficiency and enables pickup of electronic components without fail. A component feeding unit mounted with a master tape formed with pickup position indication holes is fixed to an adjusting jig. A recognition camera takes an image of a recognition mark to calculate a center position thereof, moves to a position corresponding to a component pickup position previously stored in a memory portion, and takes an image of the pickup position indication hole provided in the master tape to calculate a component pickup position. Data on a positional relationship between the recognition mark and the pickup position based on a result of this recognition processing are stored in a memory in the component feeding unit. The component feeding units each mounted with a storage tape are fixed to a base of an electronic component mounting apparatus. When an electronic component mounting operation is performed, a board recognition camera takes an image of the recognition mark provided in the component feeding unit to calculate a center position thereof, and the CPU corrects a pickup position of a suction nozzle based on the pickup position data stored in the memory.

7 Claims, 12 Drawing Sheets

ELECTRONIC COMPONENT MOUNTING METHOD

CROSS-REFERENCE OF THE INVENTION

This invention is based on Japanese Patent Application No. 2003-145834, the content of which is incorporated by reference in its entirety.

BACKGROUND OF THE INVENTION

1. Field of the Invention

The invention relates to an electronic component mounting method in which a storage tape stored with electronic components in its storage portions is intermittently fed by a component feeding unit, and a suction nozzle picks the electronic components up from the storage tape and mounts the electronic components on a printed board.

2. Description of the Related Art

Conventionally, the electronic component mounting method of this type, as described in Japanese Patent Application Publication No. Hei 5-199000, utilizes a technology of automatically detecting a component pickup position by calculating a center of a mark on a parts cassette by recognizing the mark by a recognition camera when the parts cassette is replaced and by using approximate data on each of the parts cassettes such as a component pickup position, a distance between the component pickup position and the center of the mark, and a distance between a suction nozzle and the recognition camera which are inputted in advance.

However, it is troublesome to input in advance the data such as the component pickup position, the distance between the component pickup position and the center of the mark, and the distance between the suction nozzle and the recognition camera, lowering a work efficiency.

SUMMARY OF THE INVENTION

This invention provides an electronic component mounting method which improves a work efficiency and enables pickup of electronic components without fail.

The invention provides a method of mounting an electronic component. The method includes providing a component feeding unit having a recognition mark, mounting a pickup position adjusting tape having pickup position marks on the component feeding unit, and taking an image of the recognition mark by a first recognition camera. The method also includes moving the first recognition camera to a pickup position of the component feeding unit, at which the electronic component is picked up by a suction nozzle, so as to take an image of the pickup position mark of the pickup position adjusting tape located at the pickup position of the component feeding unit. The method further includes obtaining data on a positional relationship between the recognition mark and the pickup position based on the images taken by the first recognition camera, mounting a storage tape containing the electronic component on the component feeding unit, fixing the component feeding unit to a component mounting apparatus, taking an image of the recognition mark of the component feeding unit by a second recognition camera, correcting a pickup position of the suction nozzle based on the data on the positional relationship, and picking the electronic component up from the storage tape and mounting the electronic component on a printed circuit board.

DETAILED DESCRIPTION OF THE INVENTION

An electronic component mounting apparatus having an electronic component feeding device of one embodiment of the invention will be described with reference to the drawings. This electronic component mounting apparatus is a so-called multifunctional chip mounter, which can mount a variety of electronic components A on a printed board P.

Figure 1:
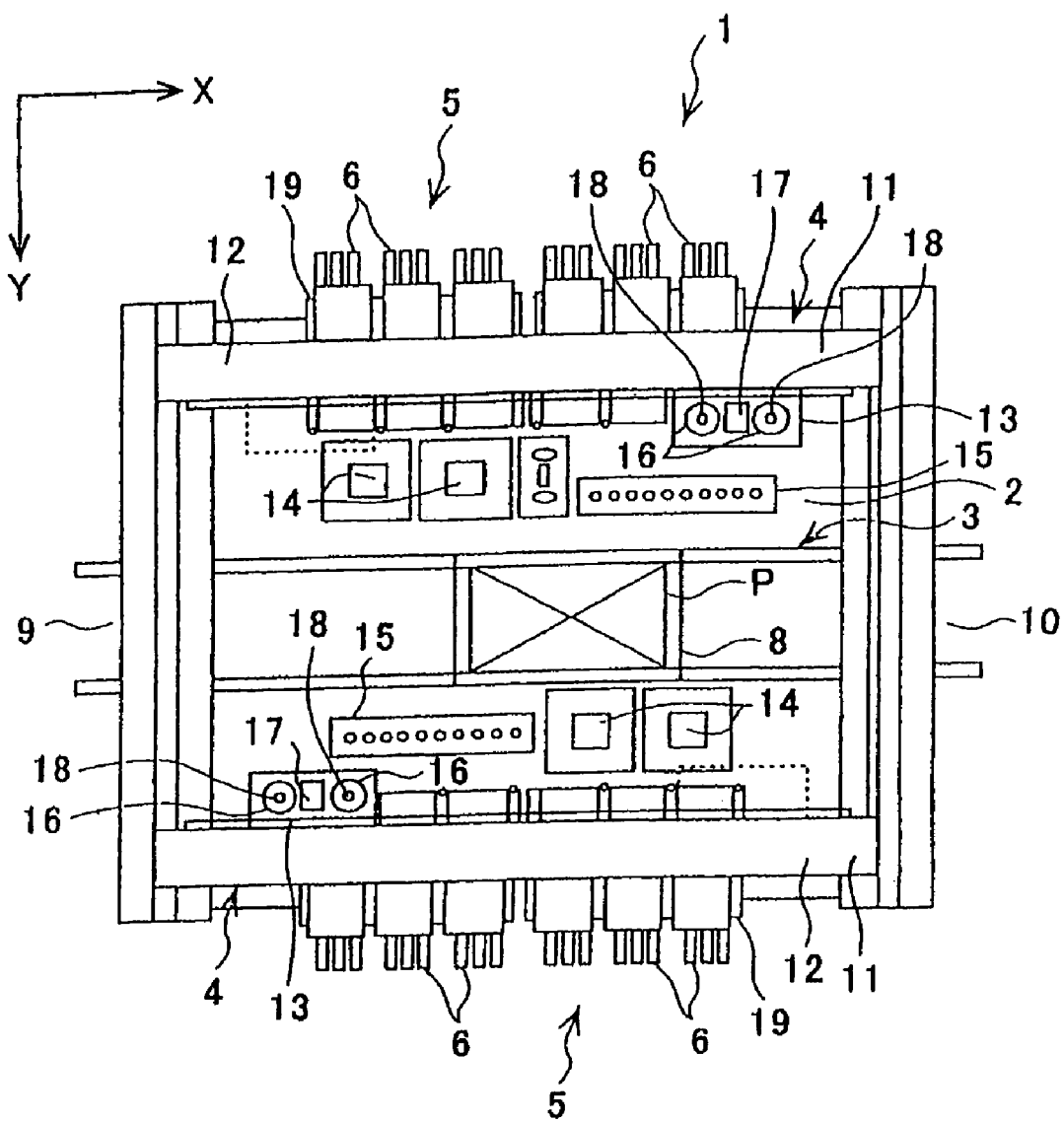
FIG. 1 is a plan view of an electronic component mounting apparatus of an embodiment of the invention.

FIG. 1 is a plan view of the electronic component mounting apparatus. An electronic component mounting apparatus 1 includes a base 2, a conveyer portion 3 extending in a lateral direction in a center of the base 2, and two component mounting portions 4 and two component feeding portions 5 each provided on the front (on a lower side of FIG. 1) and the rear (on an upper side of FIG. 1) of the base 2. Each of the component feeding portions 5 is detachably set with a plurality of component feeding units 6 as the electronic component feeding device.

The conveyer portion 3 includes a central set table 8, a left feeding conveyer 9, and a right discharging conveyer 10. The printed board P is supplied from the feeding conveyer 9 to the set table 8, and is fixed at a predetermined height so as to be mounted with electronic components. After completing the electronic component mounting, the printed board P is discharged from the set table 8 to a downstream device through the discharging conveyer 10.

Each of the component mounting portions 4 is provided with an XY stage 12 movably mounted with a head unit 13, a component recognition camera 14, and a nozzle stocker 15. The head unit 13 is mounted with two mounting heads 16 for picking up and mounting the electronic components, and a board recognition camera 17 for recognizing the printed board P. Normally, the XY stages 12 of both the component mounting portions 4 are alternately driven.

In each of the XY stages 12, a beam 11 moves in a Y direction driven by a Y axis motor 12A, and the head unit 13 moves along this beam 11 in an X direction driven by an X axis motor 12B. Therefore, the head unit 13 moves in the X and Y directions.

In each of the component feeding portions 5, many component feeding units 6 are laterally and detachably aligned on a unit base 19. Each of the component feeding units 6 is provided with a storage tape C storing many electronic components aligned at predetermined pitches, which will be described below. By intermittently feeding the storage tape C, the electronic components are fed one by one from an end of the component feeding unit 6 to the component mounting portion 4. In this electronic component mounting apparatus 1, a relatively small electronic component such as a surface mounting component is mainly fed from the component feeding unit 6, and a relatively large electronic component is fed from a tray-type component feeding device (not shown).

This electronic component mounting apparatus 1 is driven based on NC data stored in a storage portion thereof. First, the XY stage 12 is driven, the head unit 13 moves to the component feeding unit 6, and then the mounting head 16 lowers to pick a required electronic component up by a suction nozzle 18 thereof. Then, the mounting head 16 rises up, and the XY stage 12 is driven to move the electronic component to a position right above the component recognition camera 14. The component recognition camera 14 recognizes a posture and a position of the electronic component on the suction nozzle 18. Next, the head unit 13 moves over to the printed board P on the set table 8, and the board recognition camera 17 recognizes a position of the printed board P. Then, an X axis motor 12B and a Y axis motor 12A of the XY stage 12, and a θ axis motor 18A of the suction nozzle 18 operate to correct the position of the electronic component by an amount based on a recognition result of the component recognition camera 14 and the board recognition camera 17, a Z axis motor 18B is driven to lower the suction nozzle 18, and then the electronic component A is mounted on the printed board P.

The XY stage 12 of this embodiment is mounted with two mounting heads 16 (suction nozzles 18) so that two electronic components can be sequentially picked up and sequentially mounted on the printed board P. Furthermore, when the mounting head 16 has more than two suction nozzles 18, although not shown, more than two electronic components can be sequentially picked up and sequentially mounted on the printed board P.

Figure 2:
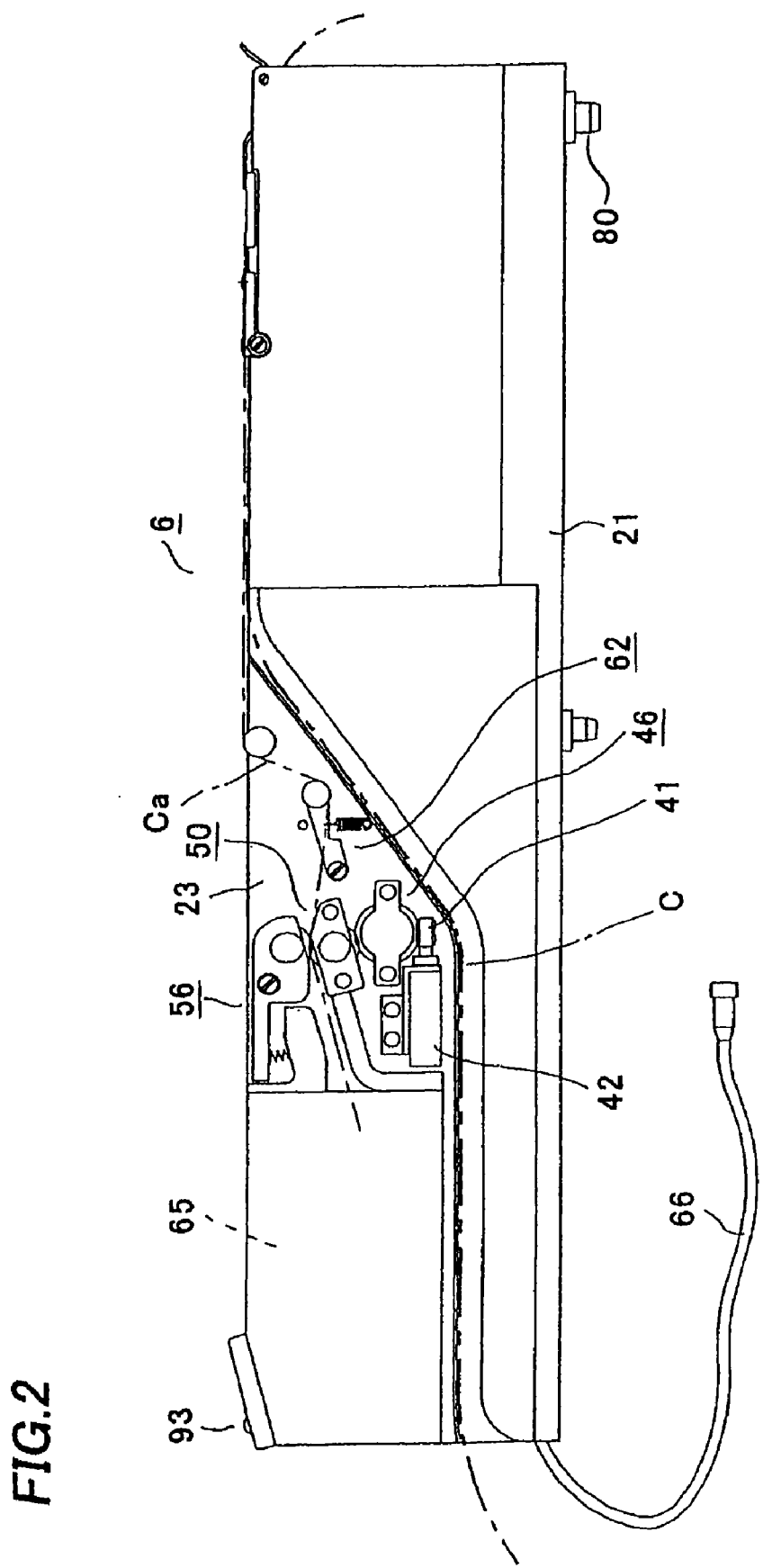
FIG. 2 is a side view of a component feeding unit of the apparatus of FIG. 1.

Next, the component feeding unit 6 will be described based on FIGS. 2 and 3. The component feeding unit 6 can employ, for example, four types of the storage tapes C, i.e., the storage tapes of 16 mm width storing electronic components aligned at 4 mm pitches, 8 mm pitches, 12 mm pitches and 16 mm pitches. The component feeding unit 6 includes a unit frame 21, a storage tape reel (not shown) rotatably mounted on the unit frame 21, a tape feeding system 22 for intermittently feeding the storage tape C let out from the storage tape reel reeled with the storage tape C to a position where the electronic component A is picked up by the suction nozzle 18, a cover tape peeling system 23 for peeling a cover tape Ca from the storage tape C just before the pickup position, and a shutter system 24 which enables picking-up of the electronic component A by opening above the electronic component A fed to the pickup position.

Figure 8:
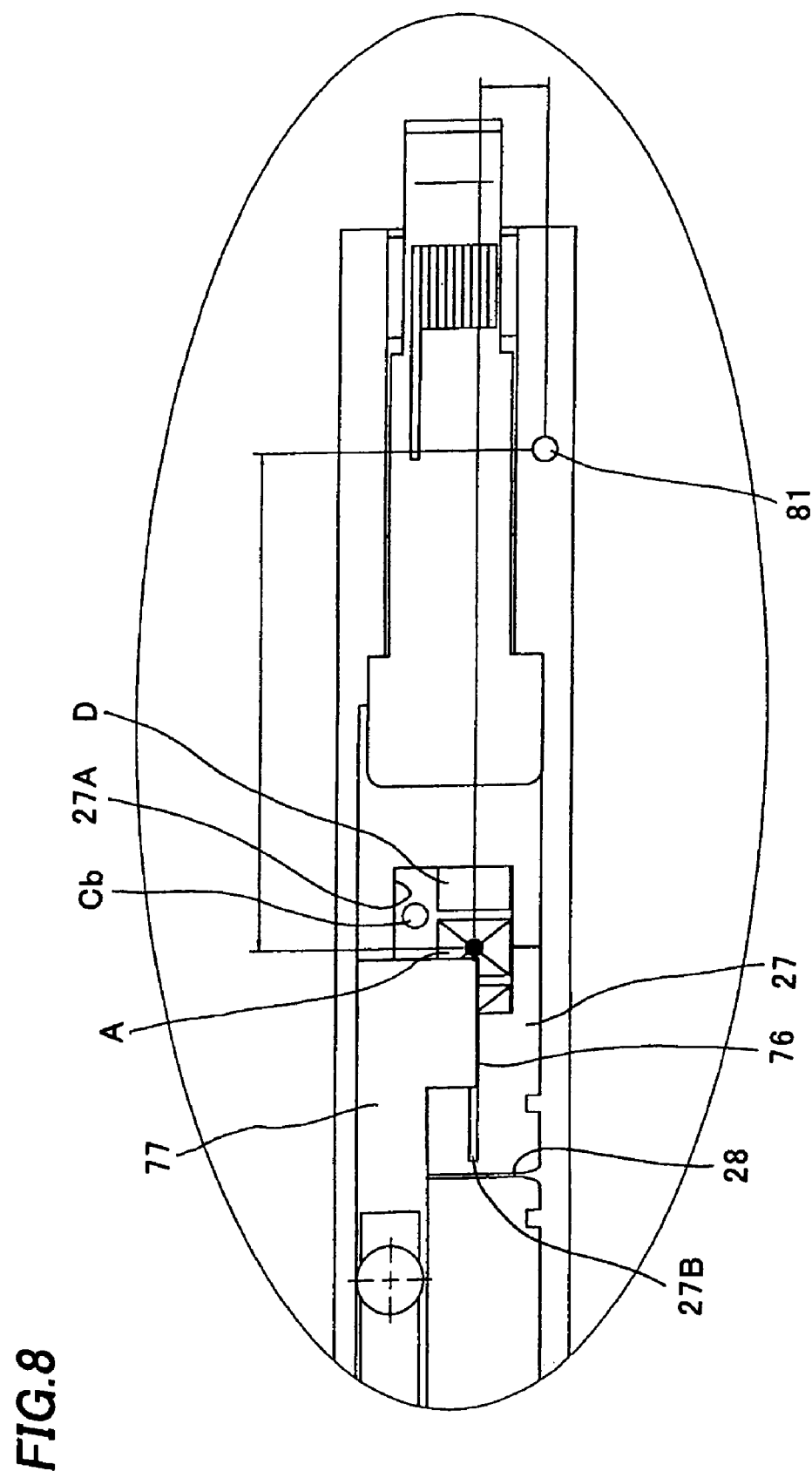
FIG. 8 is a plan view of a main portion of the component feeding unit of FIG. 2 when the shutter is closed.
Figure 9:
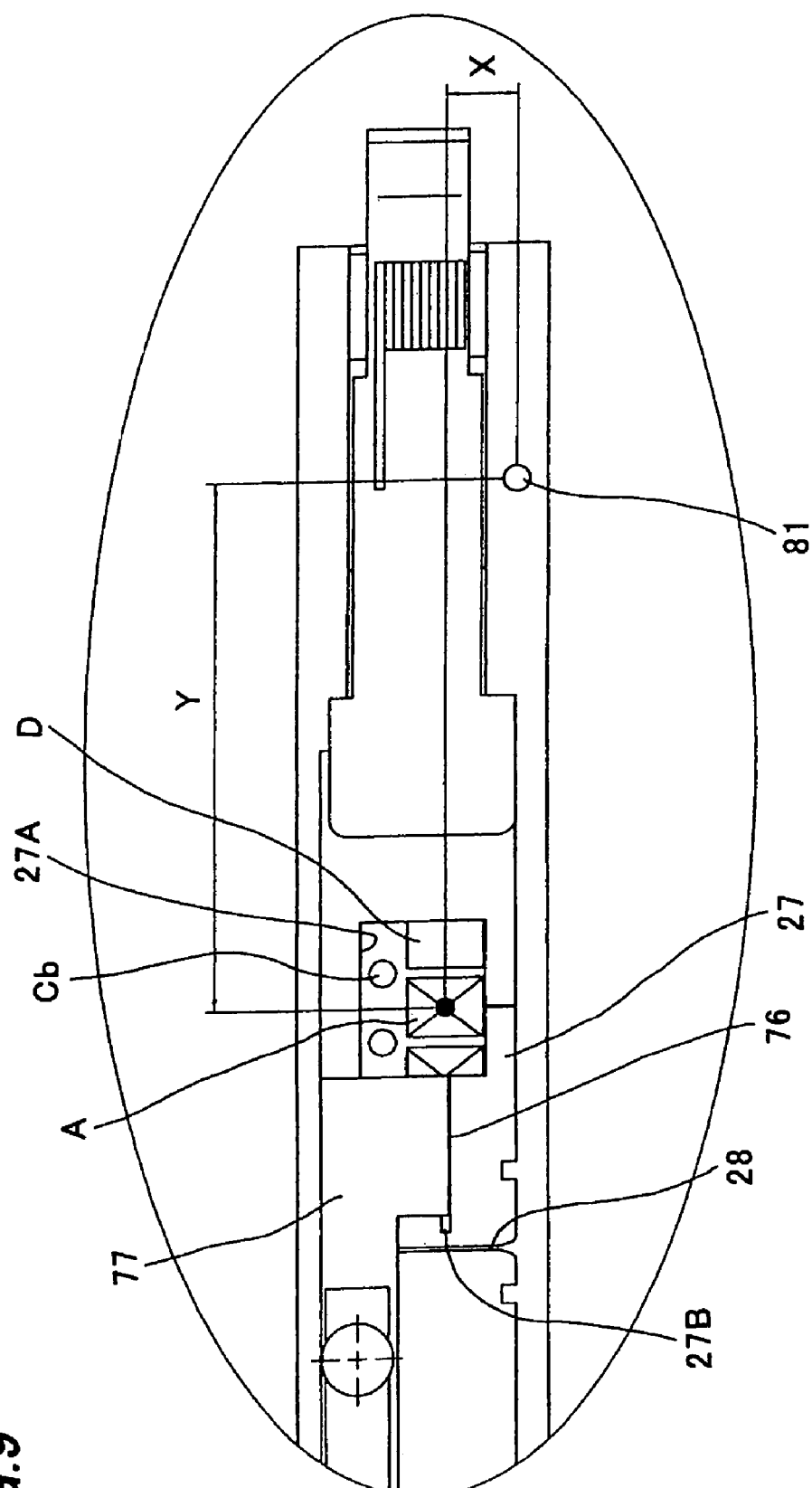
FIG. 9 is a plan view of the main portion of FIG. 8 when the shutter is open.
Figure 10:
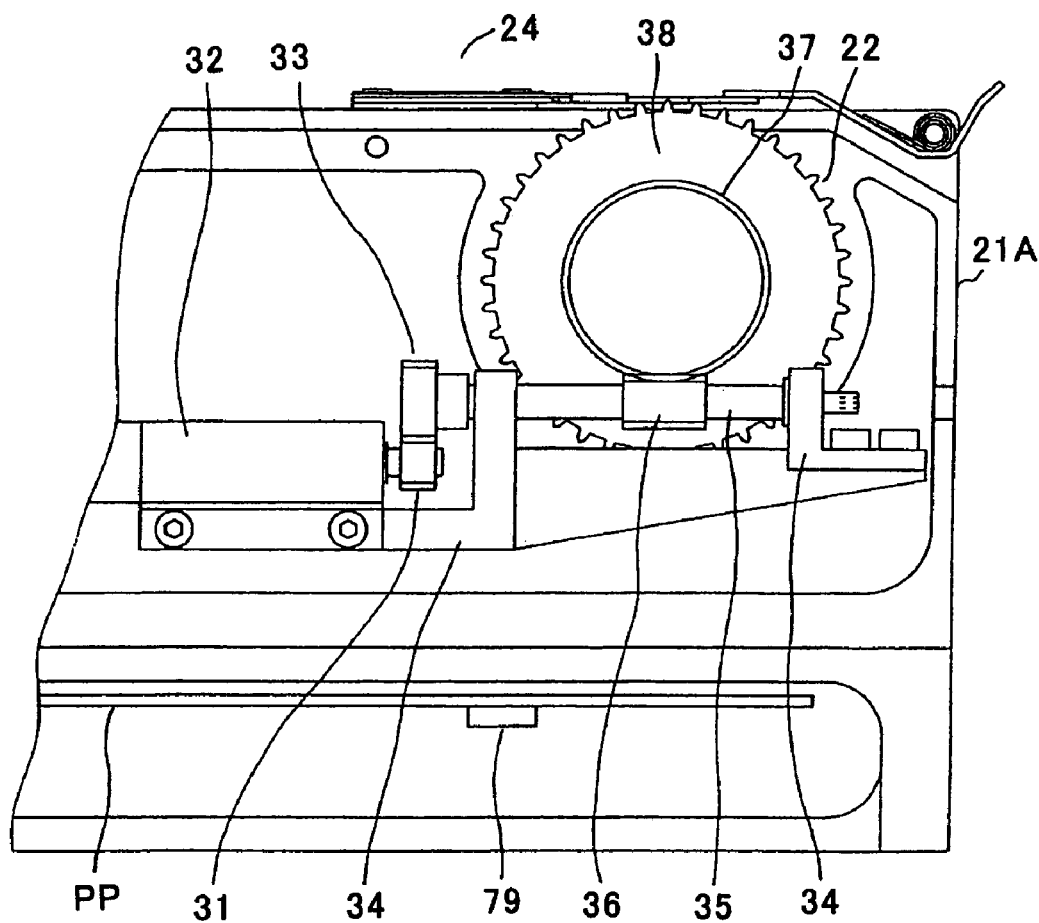
FIG. 10 is a view showing an operation for offline setup of a storage tape of the component feeding unit.

The storage tape C let out from the storage tape reel is fed to the pickup position under a suppressor 27 (shown in FIGS. 8 and 9) which is provided just before the pickup position in a tape route. This suppressor 27 is formed with an opening 27A for picking, and integrated with a shutter 77 of the shutter system 24, which will be described below, near the opening 27A. The suppressor 27 is formed with a slit 28 on one side of the shutter 77. The cover tape Ca of the storage tape C is peeled off at the slit 28, and stored in a storage portion 65 of the cover tape peeling system 23, which will be described below. That is, the electronic component A stored in the storage tape C is fed to a position under the shutter 77, which opens and closes the opening 27A for picking, with the cover tape Ca being peeled off.

Figure 3:
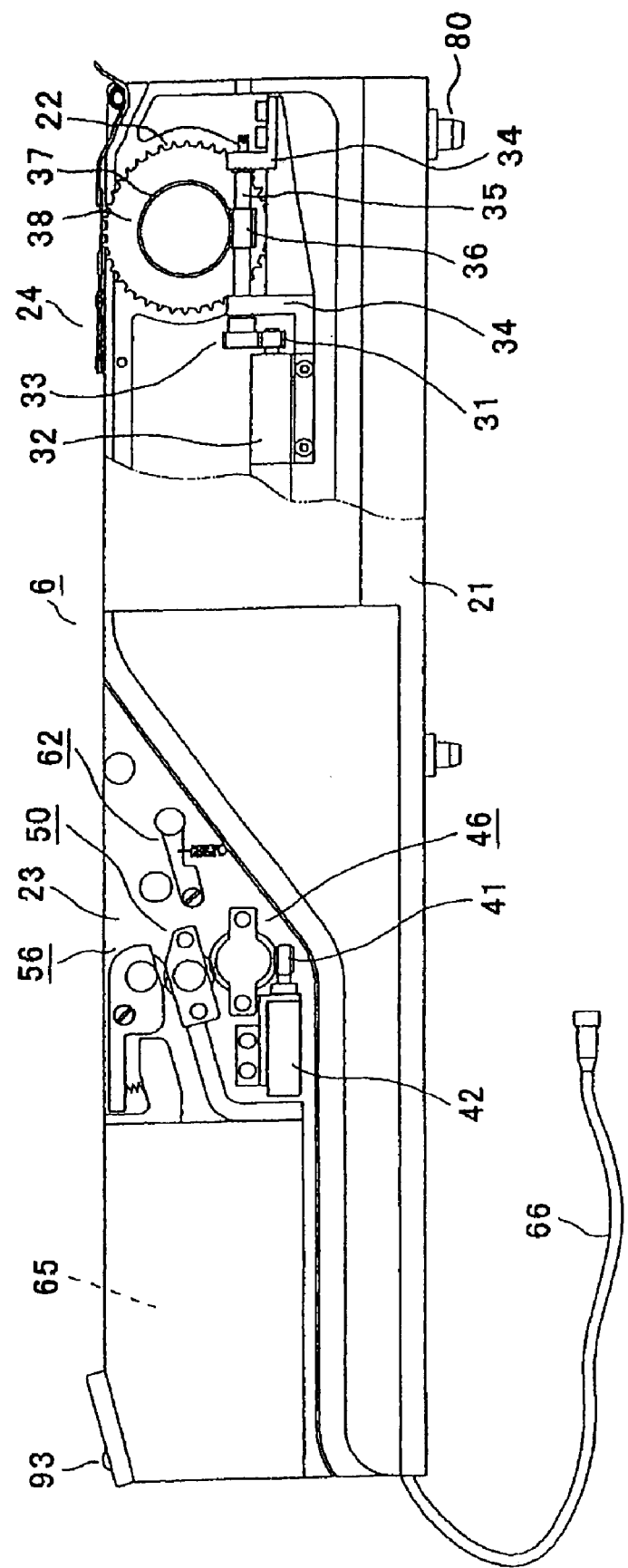
FIG. 3 is a partial side view of the component feeding unit of the apparatus of FIG. 1.

As shown in FIG. 3, the tape feeding system 22 includes a drive motor 32 provided with a gear 31 at its output axis, a rotation axis 35 rotatably supported by both supporting bodies 34 and provided with a gear 33 at its end engaged with the gear 31, and a sprocket 38 provided with a worm wheel 37 engaged with a worm gear 36 provided in a center of the rotation axis 35 and also engaged with feed holes Cb formed in the storage tape C to feed the storage tape C. Therefore, when the drive motor 32 is driven, the rotation axis 35 rotates through the gear 31 and the gear 33, and the sprocket 38 intermittently rotates by a predetermined angle through the worm gear 36 and the worm wheel 37. Then, the storage tape C is intermittently fed by the feed holes Cb.

Figure 4:
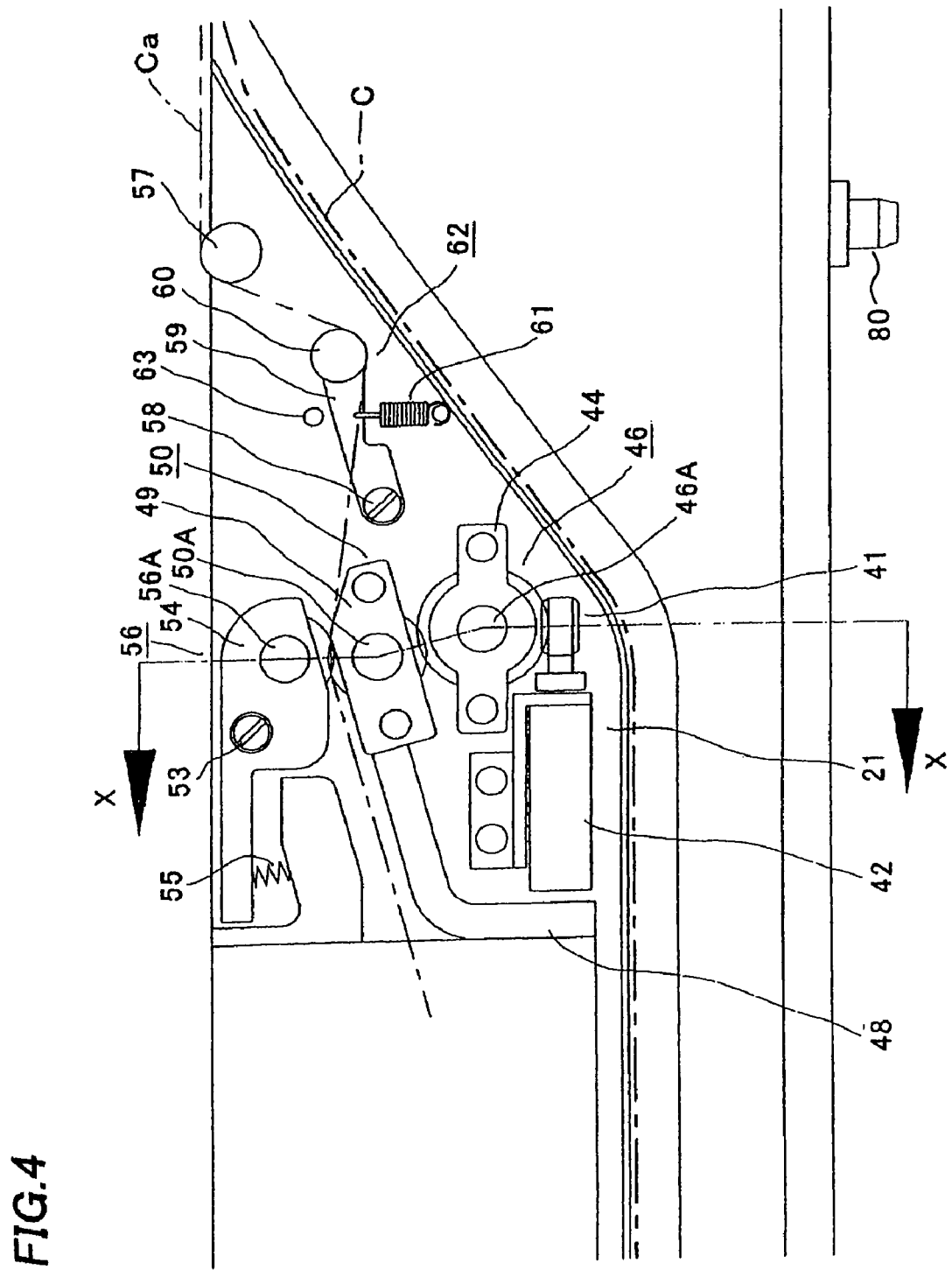
FIG. 4 is an enlarged view of a cover tape peeling system of the apparatus of FIG. 1.
Figure 5:
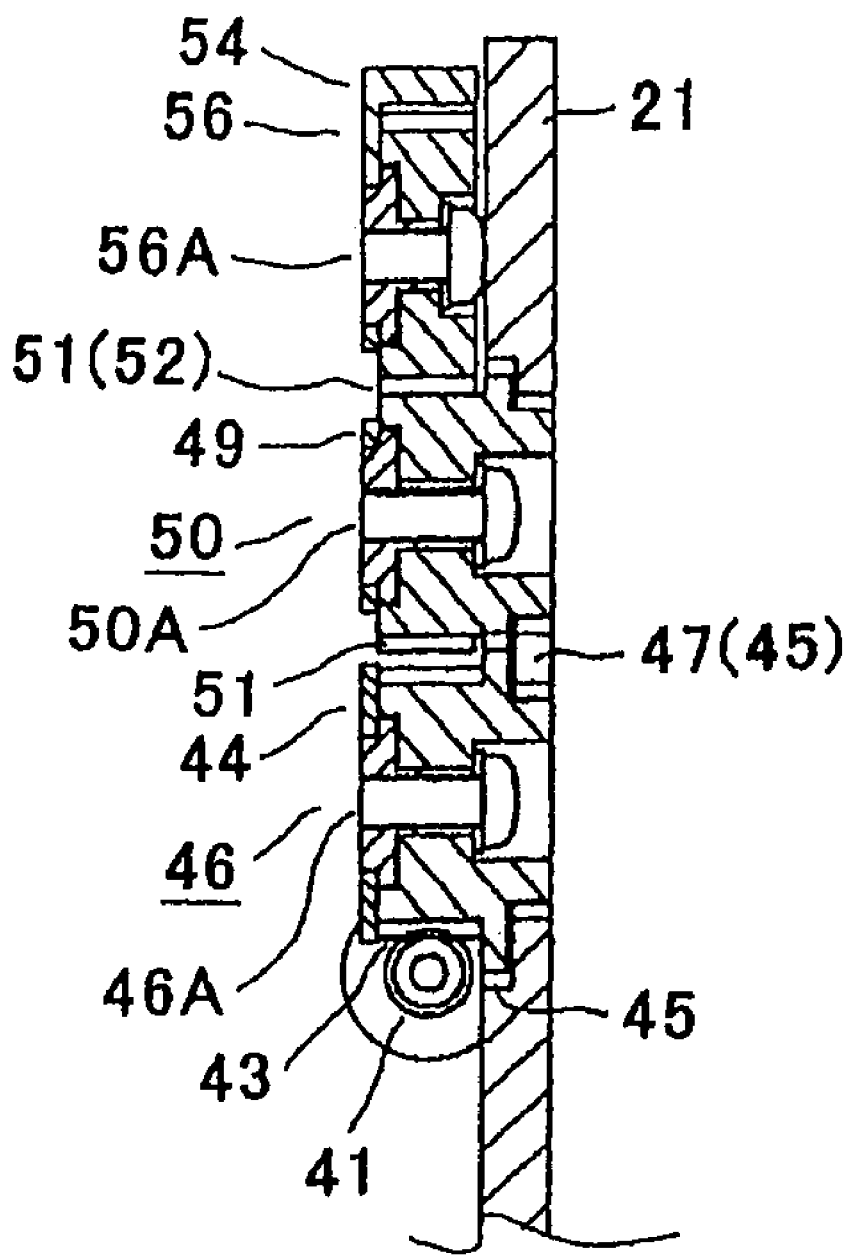
FIG. 5 is a cross-sectional view along line X—X of FIG. 4.

As shown in FIGS. 3 to 5, the cover tape peeling system 23 includes a drive motor 42, a first rotating body 46, a second rotating body 50, a third rotating body 56, a roller 57, and a tension applying body 62. The drive motor 42 is provided with a worm gear 41 at its output axis. The first rotating body 46 is provided with a gear 43 engaged with a gear 45 and the gear 41 therearound, and is rotatably supported by a supporting body 44 through a support axis 46A, the supporting body 44 being fixed on the unit frame 21. The second rotating body 50 is provided with a gear 47 engaged with a contact portion 51 and the gear 45 therearound, and is rotatably supported by a supporting body 49 through a support axis 50A, the supporting body 49 being fixed on the unit frame 21 through an attachment body 48. The third rotating body 56 is provided with a contact portion 52 contacting with the contact portion 51 being pushed by a spring 55 therearound, and is rotatably supported by an attachment body 54 through a support axis 56A, the attachment body 54 being fixed on the unit frame 21 and rotatable through a support axis 53. The roller 57 is provided for guiding the cover tape Ca. The tension applying body 62 is provided with a roller 60 for guiding the cover tape Ca guided by the roller 57 on an end of an attachment body 59, the attachment body 59 being fixed on the unit frame 21 and rotatable around a support axis 58, and applies tension to the cover tape Ca being pushed by a spring 61. A numeral 63 designates a stopper for limiting rotation of the attachment body 59 there.

When the cover tape Ca is peeled off, the drive motor 42 is driven to rotate the first rotating body 46 through the gears 41 and 43. By the rotation of the first rotating body 46, the second rotating body 50 rotates through the gears 45 and 47. By rotation of the second rotating body 50, the third rotating body 56 rotates with the cover tape Ca being interposed between the contact portions 52 and 51 pushed by the spring 55. Then, the cover tape Ca is peeled from the storage tape C by a pitch at the slit 28 of the suppressor 27 without generating the slack, and is stored in a storage portion 65 provided in an end of the component feeding unit 6.

Figure 6:
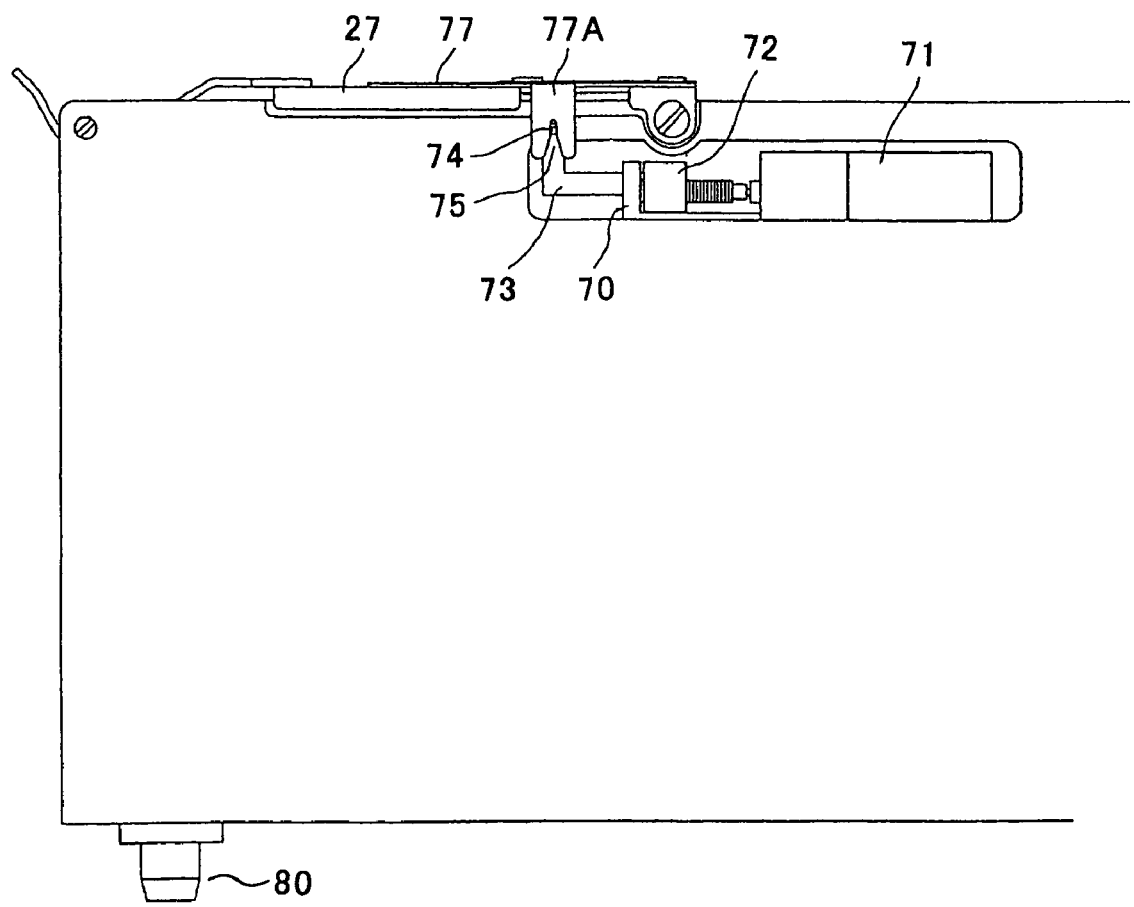
FIG. 6 is a side view of a shutter system of the component feeding unit of FIG. 2 when a shutter is closed.
Figure 7:
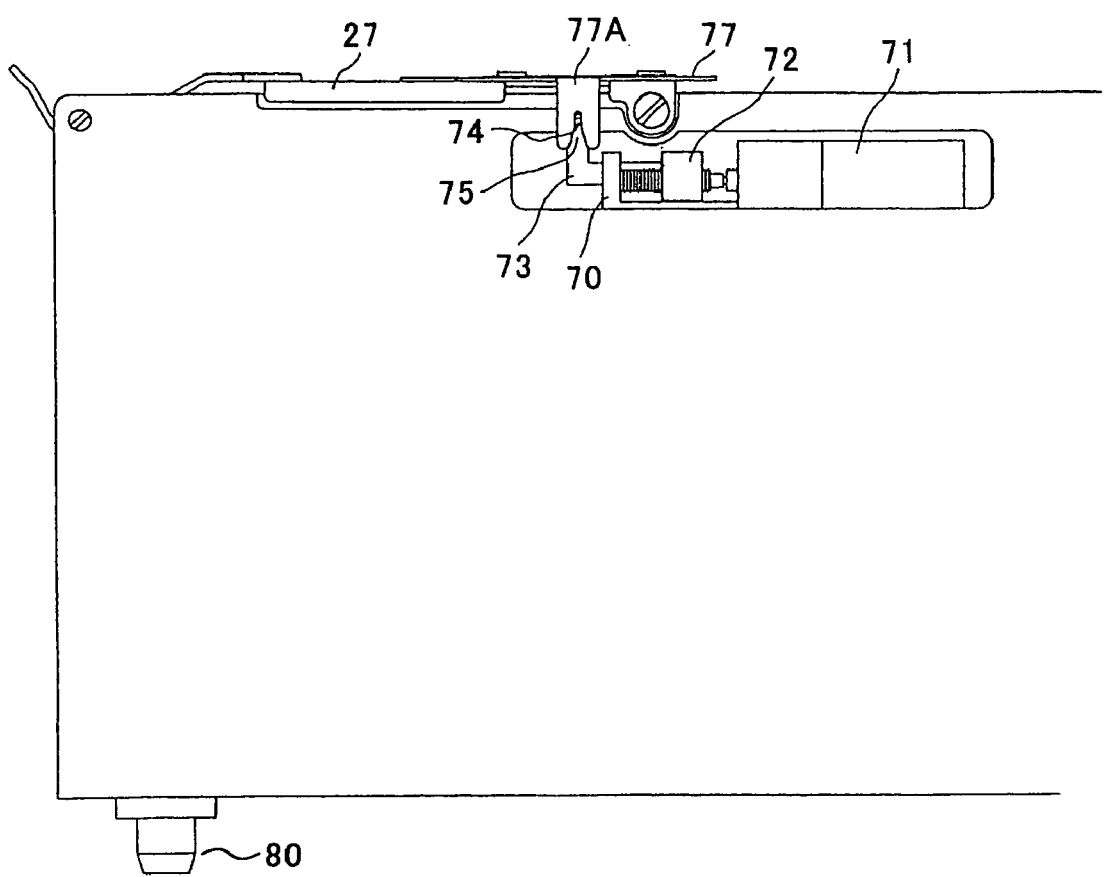
FIG. 7 is a side view of the shutter system of FIG. 6 when the shutter is open.

As shown in FIGS. 6 and 7, the shutter system 24 includes a drive motor 71 having an output axis as a screw axis supported by a supporting body 70 at its end, an operation body 73 fixed to a nut body 72 engaged with the screw axis, and a shutter 77 slidably provided on the suppressor 27. The shutter 77 has a bending piece 77A formed with a groove 75 to be fit with a pin 74 protruding from the operation body 73, and has a fitting piece 76 fitted in a guide groove 27B provided in the suppressor 27, being slidable on the suppressor 27. For opening or closing the opening 27A for picking by shifting the shutter 77, the drive motor 71 is driven to shift the nut body 72 engaged with the screw axis and the operation body 73, and then shift the fitting piece 76 along the guide groove 27B, so that the shutter 77 shifts to open or close the opening 27A.

When the shutter 77 is shifted to a closing position (FIG. 8), the shutter 77 closes the opening 27A, preventing the electronic component A fed to the pickup position from jumping out of the storage portion D of the storage tape C which the cover tape Ca is peeled from. When shifted to an opening position (FIG. 9), the shutter 77 recedes from above the electronic component A to enable picking of the component A by the suction nozzle 18.

The storage portion D is formed relatively large to have some room for storing the electronic component. A numeral 66 designates a power supply line for supplying power to the drive motors 32, 42 and 71.

Next, timings of feeding of the storage tape C, peeling of the cover tape Ca, and opening or closing of the shutter 77 will be described. The storage tape C is fed by the tape feeding system 22 by one pitch, and simultaneously with this, the cover tape peeling system 23 intermittently peels the cover tape Ca from the storage tape C by one pitch. Then, as the tape feeding system 22 and the cover tape peeling system 23 stop, the shutter system 24 performs opening operation (FIGS. 8 and 9) to open the shutter 77 above the electronic component A fed to the pickup position.

As the shutter 77 opens, the mounting head 16 picks the electronic component A up. Then, the shutter 77 closes, and simultaneously with this, the next feeding of the storage tape C and the next peeling of the cover tape Ca are performed.

Here, as described above, the component feeding unit 6 can employ four types of the storage tapes C, that is, the storage tapes storing the electronic components aligned at 4 mm pitches, 8 mm pitches, 12 mm pitches and 16 mm pitches. Therefore, the opening 27A for picking in the suppressor 27 is formed in a size corresponding to the electronic component A stored in the storage tape C of 16 mm pitch. Accordingly, the position where the suction nozzle 18 picks up a small electronic component stored in the storage tape C of 4 mm pitch is in a middle of the opening 27A.

A numeral 80 designates a positioning pin provided on each of front and rear sides of a bottom surface of the component feeding unit 6. These positioning pins 80 are inserted in positioning holes (not shown) provided in the base 2 so that the component feeding unit 6 is attached to the electronic component mounting apparatus. A numeral 81 designates a recognition mark provided on an upper surface of the unit flame 21 of the component feeding unit 6, which is printed and shaped in a circle, for example. The recognition mark 81 is not necessarily in a shape of a circle and formed by printing, but may be shaped in other shapes and formed by carving and so on.

Figure 13:
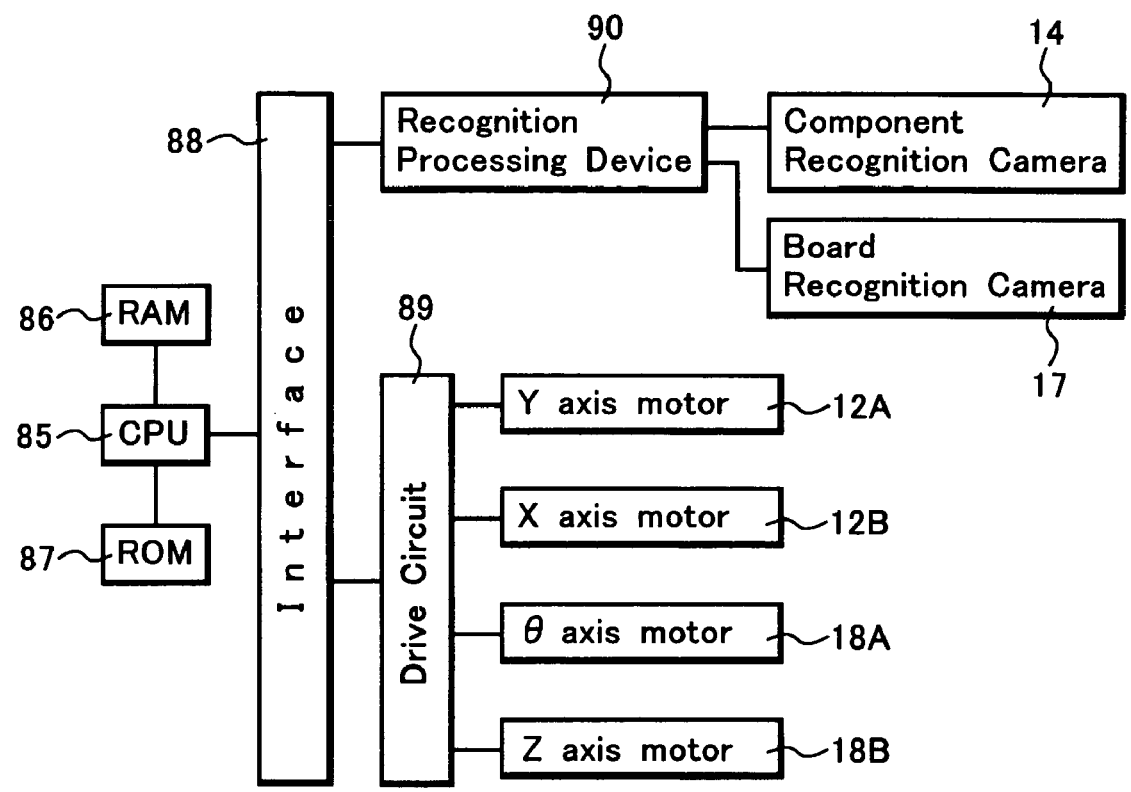
FIG. 13 is a block diagram of a control of the electronic component mounting apparatus.

Next, a block diagram of a control of the electronic component mounting apparatus will be described with reference to FIG. 13. A numeral 85 designates a CPU serving as a control device for totally controlling component picking and mounting operations of the electronic component mounting apparatus 1. A numeral 86 designates an RAM (random access memory) serving as a memory device, and a numeral 87 designates an ROM (read only memory). The CPU 85 totally controls each of drive sources for the component picking and mounting operations of the electronic component mounting apparatus through an interface 88 and a drive circuit 89 based on data stored in the RAM 86 and according to programs stored in the ROM 87.

The RAM 86 is stored with mounting data including X and Y coordinates and a mounting angle for each of step numbers (in mounting order) and component alignment numbers in the component feeding portion 5, and component data including X and Y sizes for each of the electronic components and numbers of the suction nozzles 18.

A numeral 90 designates a recognition processing device connected with the CPU 85 through the interface 88. The recognition processing device 90 performs recognition processing to images taken and stored by the component recognition camera 14 and the board recognition camera 17, and sends a recognition result to the CPU 85. That is, the CPU 85 outputs a command of performing recognition processing (e.g. calculation of a shifting amount of an electronic component from a normal position) to images taken and stored by the component recognition camera 14 and the board recognition camera 17 to the recognition processing device 90, and receives a recognition processing result from the recognition processing device 90.

That is, when the recognition processing device 90 performs recognition processing and detects a shifting amount from a normal position, this recognition result is sent to the CPU 85. Then, the CPU 85 moves the suction nozzle 18 in X and Y directions by driving the Y axis motor 12A and the X axis motor 12B and rotates the suction nozzle 18 by an angle θ by driving the θ axis motor 18A based on the component recognition result and the board recognition result, thereby completing correction of the position of the electronic component in the X and Y directions and the rotating angle along a vertical axis.

Figure 11:
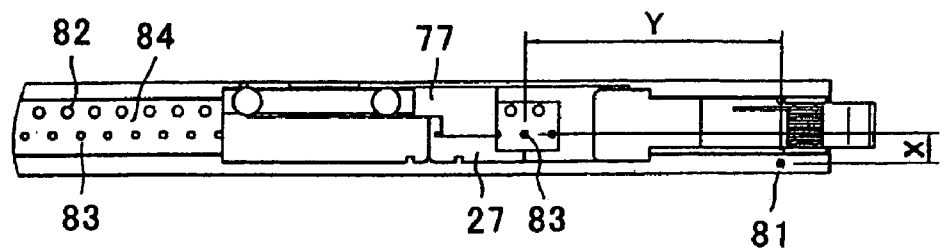
FIG. 11 is a plan view of the component feeding unit mounted with a master tape.

Next, an operation when adjusting the component feeding unit 6 will be described. First, as shown in FIG. 11, a master tape 84 for adjusting a pickup position, which is formed with feeding holes 82 to be engaged with the sprocket 38 and pickup position indication holes 83 as pickup position marks, is mounted on the component feeding unit 6. Then, this component feeding unit 6 is fixed to an adjusting jig (not shown).

Figure 12:
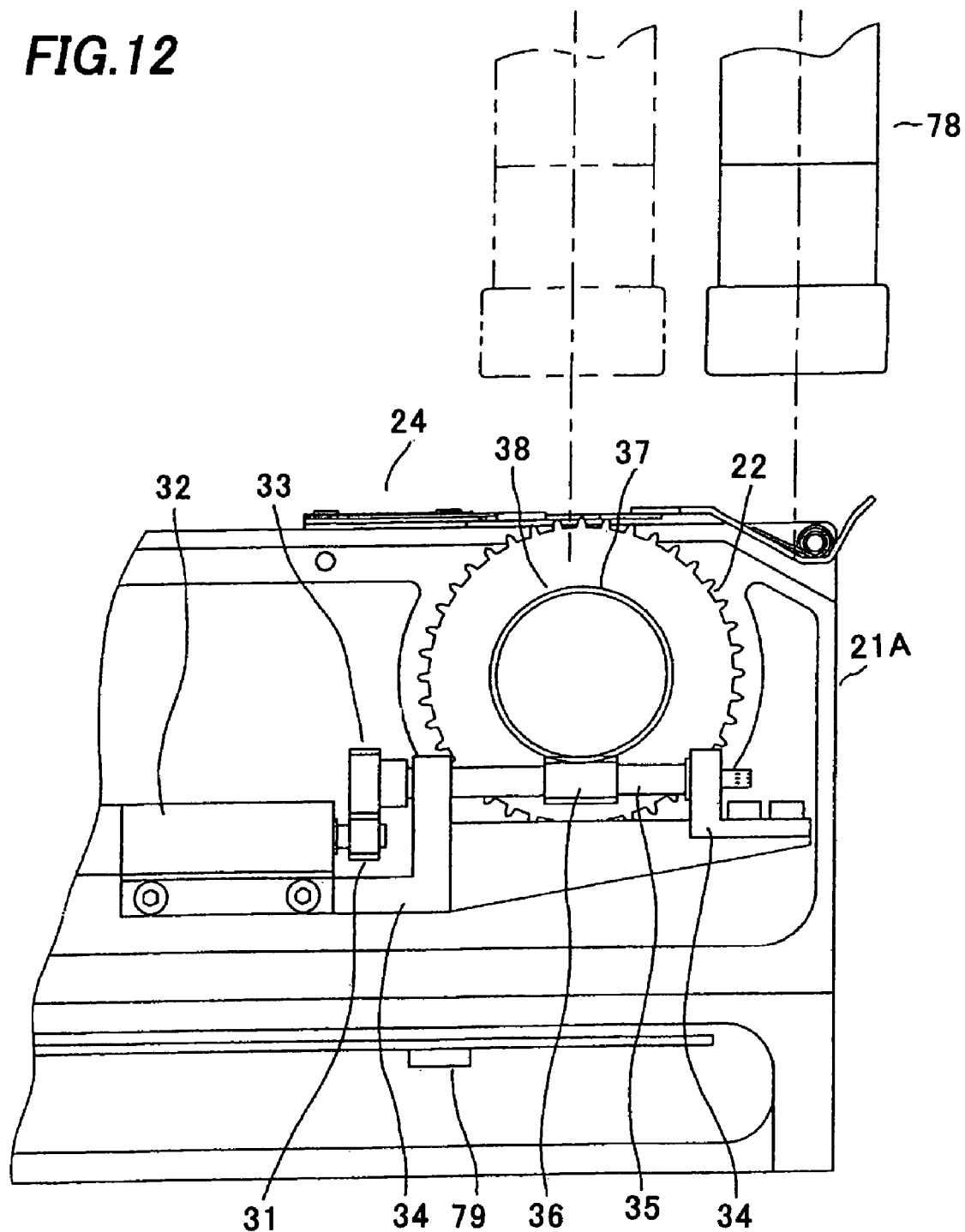
FIG. 12 is a partial side view of the component feeding unit mounted with the master tape when an image of the recognition mark is taken.

Next, as shown in FIG. 12, a recognition camera 78 takes an image of the recognition mark 81, and a recognition processing unit (not shown) performs recognition processing to this image to calculate a center position of the recognition mark 81. Then, the recognition camera 78 moves to a pickup position based on data stored in a storage unit (not shown) and takes an image of the pickup position indication hole 83 provided in the master tape 84 located at the pickup position. The recognition processing portion performs recognition processing to this image to calculate the pickup position of the component feeding unit 6. Pickup position data (data on a positional relationship between the recognition mark 81 and the pickup position of the component feeding unit 6) based on these recognition results are stored in a memory 79 attached to a printed board PP in the component feeding unit 6 in advance. As shown in FIG. 11, the positional relationship between the recognition mark 81 and the pickup position of the component feeding unit 6 is defined by distances X and Y shown in the drawing. This processing is performed for each of the component feeding units 6.

Then, the positioning pins 80 are inserted in the positioning holes provided in the base 2 to fix each of the component feeding units 6 mounted with the storage tape C to the electronic component mounting apparatus. At this time, the component pickup position of each of the component feeding units 6 may be shifted from a proper position if the positioning pins 80 are worn out or the component feeding units 6 are improperly attached to the electronic component mounting apparatus 1.

Therefore, in the electronic component mounting operation, the XY stage 12 is driven to move the head unit 13 to the component feeding unit 6, the board recognition camera 17 takes an image of the recognition mark 81 provided on the component feeding unit 6, the recognition processing device 90 performs recognition processing to the image to calculate the center position of the recognition mark 81, and then the CPU 85 corrects the pickup position of the suction nozzle 18 based on the pickup position data stored in the memory 79 described above. That is, when the XY stage 12 is driven to move the head unit 13 to the component feeding unit 6 and the suction nozzle 18 picks the electronic component up from the component feeding unit 6, the X axis motor 12B and the Y axis motor 12A of the XY stage 12 are moved by an amount to be corrected so as to pick the electronic component A up without fail.

After the electronic component is picked up, the XY stage 12 is driven to move the electronic component A to right above the component recognition camera 14 as described above, and the component recognition camera 14 recognizes a posture of the electronic component A and a shifting amount of the electronic component A from a normal position on the suction nozzle 18. Then, the mounting head 16 moves over to the printed board P on the set table 8, and the board recognition camera 17 recognizes the position of the printed board P. Then, the CPU 85 moves the X axis motor 12B and the Y axis motor 12A of the XY stage 12 and the θ axis motor 18A of the suction nozzle 18 by an amount to be corrected based on the recognition result of the recognition processing device 90 based on the image taken by the component recognition camera 14 and the board recognition camera 17, and mounts the electronic component A on the printed board P.

Although the multifunctional chip mounter is used as an example of the electronic component mounting apparatus in this embodiment, the invention is not limited to this but can be applied to a high speed chip mounter of rotary table type.

Although one embodiment of the invention has been disclosed in detail, it will be recognized that variations or modifications of the disclosed apparatus lie within the scope of the present invention.

What is claimed is:

1. A method of mounting an electronic component, comprising:

providing a component feeding unit having a recognition mark;

mounting a pickup position adjusting tape having pickup position marks on the component feeding unit;

taking an image of the recognition mark by a first recognition camera;

moving the first recognition camera to a pickup position of the component feeding unit, at which the electronic component is picked up by a suction nozzle, so as to take an image of the pickup position mark of the pickup position adjusting tape located at the pickup position of the component feeding unit;

obtaining data on a positional relationship between the recognition mark and the pickup position of the component feeding unit based on the images taken by the first recognition camera;

mounting a storage tape containing the electronic component on the component feeding unit;

fixing the component feeding unit to a component mounting apparatus;

taking an image of the recognition mark of the component feeding unit by a second recognition camera;

correcting a pickup position of the suction nozzle based on the data on the positional relationship; and picking the electronic component up from the storage tape and mounting the electronic component on a printed circuit board.

2. The method of claim 1, wherein the pickup position marks are pickup position indication holes formed in the pickup position adjusting tape.

3. The method of claim 1, wherein the data on the positional relationship comprises data on differences between coordinates of the recognition mark and coordinates of the pickup position of the component feeding unit.

4. The method of claim 1, wherein the second recognition camera is a camera for recognizing the printed circuit board.

5. The method of claim 1, further comprising mounting the component feeding unit on a jig before taking the image of the recognition mark.

6. The method of claim 1, further comprising calculating a center position of the recognition mark and using the calculated center position for obtaining the data on the positional relationship.

7. The method of claim 1, further comprising storing the data on the positional relationship in a memory attached to the component feeding unit.

* * * * *